United States Patent [19]

Hasegawa

[11] Patent Number: 5,293,302
[45] Date of Patent: Mar. 8, 1994

[54] ELECTRONIC PART ASSEMBLY

[75] Inventor: Miki Hasegawa, Kyoto, Japan

[73] Assignee: Rohm Co., Ltd., Kyoto, Japan

[21] Appl. No.: 29,225

[22] Filed: Mar. 10, 1993

[30] Foreign Application Priority Data

Mar. 25, 1992 [JP] Japan .................................. 4-067139

[51] Int. Cl.⁵ .............................................. H05K 1/14
[52] U.S. Cl. ...................... 361/784; 361/796
[58] Field of Search .............. 361/760, 761, 784, 785, 361/792, 796, 825; 257/685, 686; 211/41

[56] References Cited

U.S. PATENT DOCUMENTS

| 3,725,744 | 4/1973 | Reed. | |
| 4,602,316 | 7/1986 | Feick | 361/412 |
| 4,868,462 | 9/1989 | Chattin | 361/412 |
| 5,057,968 | 10/1991 | Morrison | 361/415 |

FOREIGN PATENT DOCUMENTS

3733072A1  4/1989  Fed. Rep. of Germany.

OTHER PUBLICATIONS

IEEE Transactions on Biomedical Engineering; "A Package Design Technique for Size Reduction, of Implantable Bioelectronic System", vol. 37, No. 5, Date: May, 1990.

Primary Examiner—Leo P. Picard
Assistant Examiner—Bot Lee Ledynh
Attorney, Agent, or Firm—Nikaido, Marmelstein, Murray & Oram

[57] ABSTRACT

An electronic part assembly composed of a wiring board formed with a wiring circuit, and a plurality of electronic parts mounted to the wiring board, in which the wiring board is composed of a plurality of stages stacked up; the electronic parts are sorted into large parts which are high profile and small parts and disposed separately on the wiring board, while at least some of the small parts are each vertically disposed in the longitudinal direction of the wiring board and connected to adjacent stages of the wiring board by means of leads extending from the bath sides thereof.

5 Claims, 2 Drawing Sheets

ELECTRONIC PART ASSEMBLY

BACKGROUND OF THE INVENTION

The present invention relates to an electronic part assembly wherein electronic parts are assembled on a wiring board and connected to each other on the board to form an electronic circuit. More particularly, it relates to such an assembly capable of packaging many electronic parts in a small space by stacking up a plurality of wiring boards to form a three-dimensional structure.

In a typical example of a conventional assembly wherein electronic parts are assembled and connected to a wiring board to form an electronic circuit, a plurality of lead wires (hereinafter referred to as leads) of each electronic part are inserted respectively in holes of a printed wiring board which is formed by, for example, printing a wiring circuit on the lower surface of the printed wiring board and the inserted leads are soldered to the wiring board to make electric connections, thus forming an electronic circuit.

Recently, there has been an increase in surface-mounting type devices in which leadless-type electronic parts are mounted directly on the surface of a wiring board to provide electric connections of the parts. There is also a wiring board of the type having a wiring circuit on both the upper and lower sides thereof. In other words, there is also a double-sided board.

Further, to improve the packaging density for an increased number of electronic parts to be mounted, a double-sided board as shown in FIB. 2 is being utilized, wherein electronic parts 28 are mounted on both the upper 26 and lower 27 of a wiring board.

Recently such an IC as to have many pins compared with the conventional IC has been produced. Therefore, the IC is provided with leads densily so that a contact between adjacent leads tends to happen. For that reason, the IC having leads alternately bent upwardly and downwardly has been proposed. An assembly structure for mounting such IC on a wiring board, as shown in FIG. 3, wherein a supplemental wiring board 30 is disposed above a main wiring board 29 and an IC 31 is mounted and connected therebetween to form a circuit.

As described above, any of the conventional assembly is substantially a two-dimensional assembly wherein electronic parts are arranged on the same wiring board and each connected thereto with leads extending from its opposite sides. Accordingly, with an assembly structure in which intermingled are a low-profile part occupying a relatively large area of a wiring board and a high-profile part such as an electrolytic capacitor, the low-profile part occupies a fairly large packaging area while on the other hand the high-profile part occupies a space above the wiring board. Therefore, stacking up a plurality of assemblies of such type makes many useless spaces inevitably and lower the packaging density, thus resulting in hindrance to down-sizing of electronic apparatus.

An object of the present invention is to provide an electronic part assembly structure with an improved packaging density for contributing to down-sizing of electronic apparatus.

SUMMARY OF THE INVENTION

According to the present invention, there is provided an electronic part assembly structure comprising a wiring board formed with a wiring circuit, and a plurality of electronic parts mounted to the wiring board, wherein the wiring board is composed of a plurality of stages stacked up one above another; and the electronic parts are sorted into large parts which are high profile and small parts and disposed separately on the wiring board, while at least some of the small parts are each vertically disposed in the longitudinal direction of the wiring board and connected to adjacent stages of the wiring board by means of leads extending from the opposite sides thereof.

It is preferable that the electronic part assembly of claim 1, further comprising a vertical board disposed normal to and on one side of the wiring board composed of a plurality of stages to which the electronic parts are mounted, wherein at least some of the stages are supported by the vertical board, while wiring circuits of the respective stages are mutually connected through a wiring circuit formed on the vertical board.

It is preferable that at least a part of the leads of the small parts being vertically disposed in the longitudinal direction can be connected to adjacent wiring boards by extending said leads through a through-hole.

It is preferable that at least a part of the wiring boards are supported by using a spacer which is interposed between adjacent wiring boards.

It is preferable that the wiring board is a printed wiring board.

According to the present invention, at least two wiring boards are stacked one above the other; parts each having leads on both sides thereof, especially low-profile parts having a relatively large area are each disposed vertically in the longitudinal direction of the wiring boards; and the leads on both sides of each of the parts are connected to the upper and lower wiring boards, respectively. Hence, a space occupied by such parts in terms of the plane of a board can be reduced; therefore, an increased number of parts can be mounted to a wiring board per unit area of the board.

With high-profile parts, on the other hand, the space between the wiring boards can be set to match the height of each part.

As a whole, the packaging density of electronic parts is greatly increased than ever.

DETAILED DESCRIPTION

Figure 1:
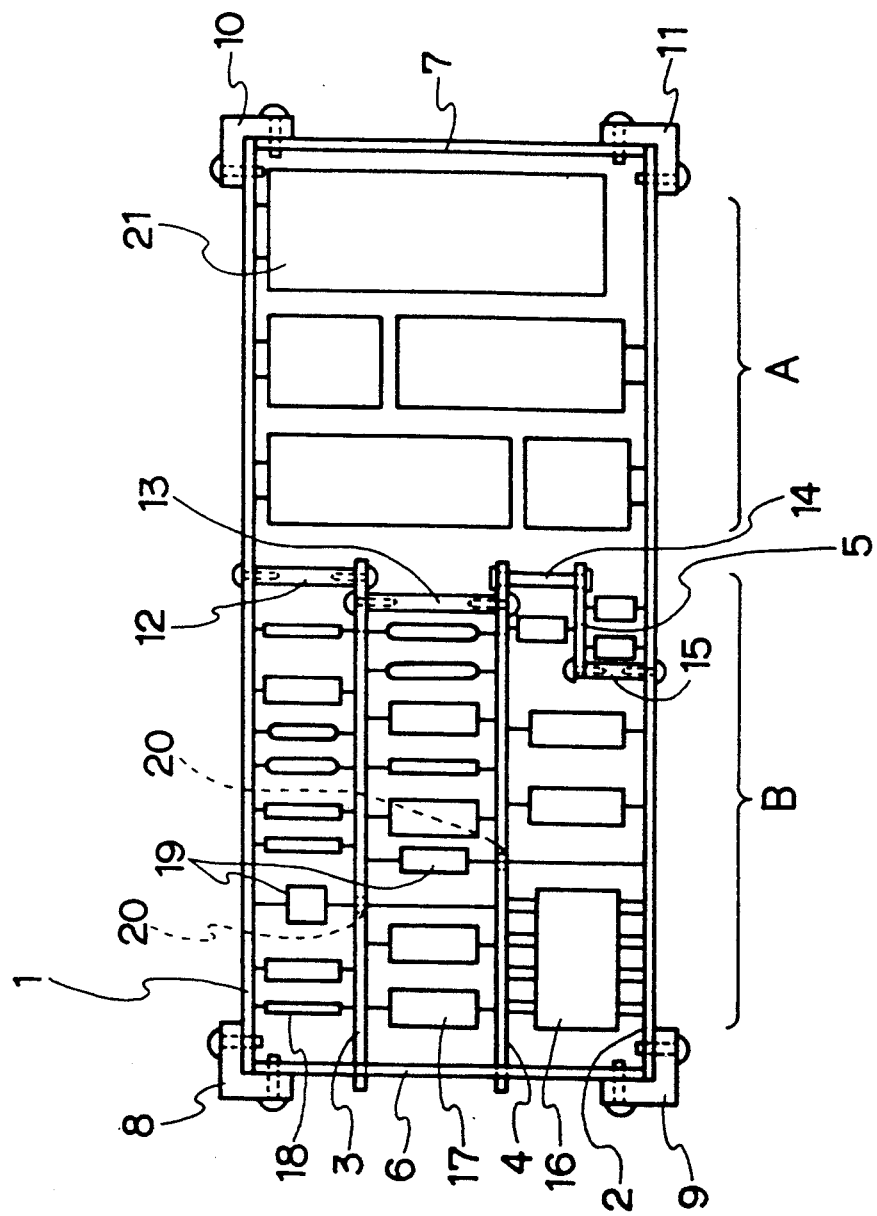
FIG. 1 is a schematic view for illustrating an electronic part assembly structure embodying the present invention.
Figure 2:
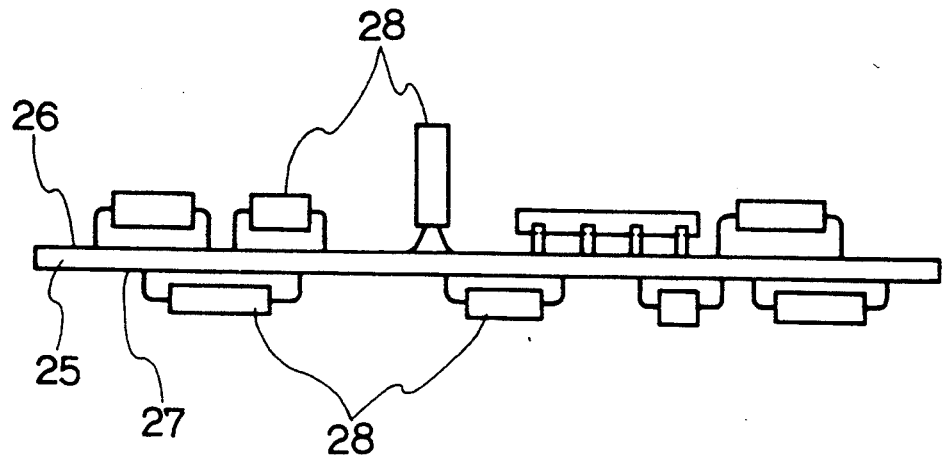
FIG. 2 is a schematic view for illustrating a conventional electronic part assembly structure of the double-sided mounting type.
Figure 3:
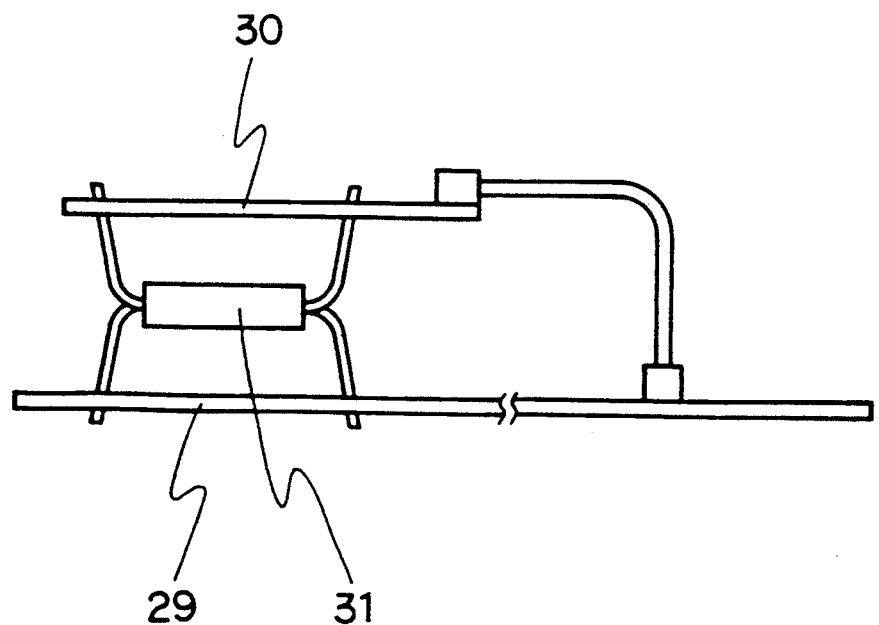
FIG. 3 is a schematic view for showing an example of a conventional IC assembly wherein leads of an IC are extending upwardly and downwardly.

Now, the present invention will be described in more detail with reference to the drawings. FIG. 1 is a front view showing an electronic part assembly structure embodying the present invention, wherein five stages of wiring boards are stacked up one above another.

Referring to FIG. 1, a first wiring board 1 and second wiring board 2 for mounting and connecting electronic parts form a upper board and lower board of the electronic part assembly, respectively. In this embodiment a third wiring board 3, fourth wiring board 4 and fifth wiring board 5 are disposed between the first and second wiring boards 1, 2 to mount and connect the electronic parts. These wiring boards are electrically connected to each other in advance, for forming a circuit when the parts are connected thereto. On opposite sides of the structure a first vertical board 6 and a second vertical board 2 are respectively disposed perpendicular to the wiring boards and fixed to the first wiring board 1 and second wiring board 2 by means of angle joints 8, 9, 10 and 11. The third and fourth wiring boards 3 and 4 are secured to the first vertical board 6 by fitting or by screws.

The other ends of the third and fourth wiring boards 3, 4 as well as the fifth wiring board 5 are mutually fixed by means of spacers 12, 13, 14 and 15. Those ends of the third and fourth wiring boards 3, 4 might be fixed to a vertical board interposed between the first and second wiring boards 1, 2. Otherwise, the third and fourth wiring boards 3, 4 might be supported by the first vertical board 6 at their one ends only with their other ends left free, or they might be supported by the first vertical board 6 and another vertical board (not shown) disposed perpendicular to the wiring boards 3, 4 and parallel to the face of the drawing sheet. The support by that another vertical board is not necessarily needed if other means (to be described later) is used to connect between a plurality of stages of wiring boards instead of using a vertical board. Yet, the horizontally disposed wiring boards might be supported using other spacers or fixing frames.

In the present embodiment, the third, fourth and fifth wiring boards 3, 4 and 5 are respectively cut to predetermined lengths to provide a space (portion A in FIG. 1) for disposing large or high-profile parts such as an aluminum electrolytic capacitor 21 and the like, whereby the space between the first and second wiring boards 1, 2 can be fully utilized. In a portion B for disposing medium-size parts such as an IC 16 and the like and small-size parts such as radial part 17 and chip part 18, the third, fourth and fifth wiring boards 3, 4 and 5 are disposed with the spaces therebetween being adjusted to match the sizes or heights of the parts to be mounted. The separate arrangement, or disposing large or high-profile parts and low-profile parts in divided spaces respectively, which is one feature of the present invention, makes it possible to effectively utilize the space of the structure, hence increase the packaging density thereof.

Also in the present embodiment, the IC 16 of the dual in-line package type (referred to as "DIP" hereinafter) is disposed vertically so as to make the two rows of leads positioned one above the other, thereby connecting the IC 16 between vertically adjacent wiring boards (second and fourth wiring boards 2 and 4 in FIG. 1). Similarly the radial part 17 such as a resistor or the like, which has leads extending from the opposite sides thereof, is also connected between vertically adjacent wiring boards (the third and fourth wiring boards 3 and 4 in FIG. 1). The second feature of the present invention resides in this arrangement wherein electronic parts are each disposed vertically in the longitudinal direction so as to be connected between the vertically adjacent wiring boards. Such arrangement enables to package electronic parts in a reduced area of a wiring board.

All the medium-size and small-size parts do not have to be disposed vertically, and some of these can be laid horizontally according to need. Even if it is the case, vertical disposition of not a few parts contributes to a decrease in packaging area. Further, all the vertically-disposed parts do not have to be connected between the vertically adjacent wiring boards, and some of these can be connected to alternate wiring boards by extending leads on one side of the part through a through-hole 20 to the target wiring board.

In the present embodiment, the wiring boards for mounting electronic parts are fixed at one ends thereof to the vertical board and mutually connected through the wiring circuit formed on the vertical board, whereby an electronic part assembly structure is formed three-dimensionally. If one vertical board is insufficient to form a complete wiring circuit, another vertical board can be provided on the other side of the wiring boards to form a complete wiring circuit. This arrangement is convenient to form a wiring circuit of the type wherein a plurality of stages of wiring boards are secured to a vertical board and mutually connected thereby. However, the vertical board having a wiring circuit is not always necessary if the connection between the wiring boards can be made by direct connection between electronic parts and connection to the wiring boards by means of leads to form a complete circuit. In this case, the circuit arrangement can be flexibly achieved if a part 19, which is connected to one wiring board at one side thereof and to another wiring board at the other side thereof by skipping over one or a plurality of wiring boards, is connected to the target wiring board 2 or 4 through the through-hole 20 formed in the wiring board 4 or 3.

The embodiment described above has been explained with reference to an example wherein three stages of wiring boards are disposed between the first and second wiring boards 1 and 2. However, the number of stages of wiring boards is not particularly limited in the present invention, for example, a provision of only the first and second wiring boards 1 and 2 would be sufficient to greatly improve the packaging density by disposing the parts vertically in the longitudinal direction, if the large parts to be disposed in the portion are not so tall.

Further, when the number of the electronic parts is fairly large, a wiring board having the same size as the first or second wiring board can be provided above the first wiring board or below the second wiring board for mounting a large number of parts in a three-dimensional structure. Components having slightly different heights or lengths can be connected to adjacent wiring boards by using an adjuster connectable to a wiring board by means of a screw or the like to make the heights of the parts uniform.

The electronic part assembly structure can be assembled in the following manner: wiring boards each formed with a previously-designed wiring circuit by printing or the like are assembled together; leads of each electronic part are inserted into predetermined holes formed in the wiring boards, or a surface-mounting type part is disposed in a predetermined position of any one of the wiring boards; and paste and solder are placed in each connection part, and the whole structure is heated to 200° to 260° C. in a furnace to effect soldering at a time.

In the present invention, there are provided a plurality of stages of wiring boards for assembling and connecting electronic parts; the electronic parts are sorted into large or high-profile parts and small or low-profile parts and disposed separately in divided portions of the structure; and at least some of the small or low-profile parts having leads on opposite sides thereof are connected between lower and upper stages of wiring boards. Hence, the low-profile parts each having a relatively large area can be disposed vertically in the longitudinal direction of the structure so as to reduce the area of the wiring board occupied by such parts, thereby obtaining an electronic part assembly structure having a high packaging density with its space effectively utilized.

As a result, the present invention takes effect of providing a down-sized and high performance electronic device having a number of electronic parts in a limited area, so as to cope with a recent trend of assembling many electronic parts to make an electronic apparatus exhibit high performance.

What is claimed is:

1. An electronic part assembly comprising a wiring board formed with a wiring circuit, and a plurality of electronic parts mounted to the wiring board, wherein the wiring board is composed of a plurality of stages stacked up; the electronic parts are sorted into large parts which are high profile and small parts and disposed separately on the wiring board, while at least some of the small parts are each vertically disposed in the longitudinal direction of the wiring board and connected to adjacent stages of the wiring board by means of leads extending from the bath sides thereof.

2. An electronic part assembly of claim 1, further comprising a vertical board disposed normal to and on one side of the wiring board composed of a plurality of stages to which the electronic parts are mounted, wherein at least some of the stages are supported by the vertical board, while wiring circuits of the respective stages are mutually connected through a wiring circuit formed on the vertical board.

3. An electronic part assembly of claim 1, wherein at least a part of the leads of the small parts being vertically disposed in the longitudinal direction can be connected to adjacent wiring boards by extending said leads through a through-hole.

4. An electronic part assembly of claim 1, wherein at least a part of the wiring boards are supported by using a spacer which is interposed between adjacent wiring boards.

5. An electronic part assembly of claim 1, wherein the wiriling board is a printed wiring board.

* * * * *